(12) United States Patent
Bao et al.

(10) Patent No.: US 9,397,058 B2
(45) Date of Patent: Jul. 19, 2016

(54) SEMICONDUCTOR DEVICE AND METHOD OF FORMING PATTERNED REPASSIVATION OPENINGS BETWEEN RDL AND UBM TO REDUCE ADVERSE EFFECTS OF ELECTRO-MIGRATION

(71) Applicant: STATS ChipPAC, Ltd., Singapore (SG)

(72) Inventors: Xusheng Bao, Singapore (SG); Ma Phoo Pwint Hlaing, Singapore (SG); Jian Zuo, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/563,448

(22) Filed: Dec. 8, 2014

(65) Prior Publication Data

US 2015/0091165 A1    Apr. 2, 2015

Related U.S. Application Data

(63) Continuation of application No. 13/312,730, filed on Dec. 6, 2011, now Pat. No. 8,963,326.

(51) Int. Cl.
*H01L 23/00* (2006.01)
*H01L 23/31* (2006.01)
(Continued)

(52) U.S. Cl.
CPC ............ *H01L 24/11* (2013.01); *H01L 23/3114* (2013.01); *H01L 23/5329* (2013.01); *H01L 24/05* (2013.01); *H01L 24/13* (2013.01); *H01L 23/525* (2013.01); *H01L 24/03* (2013.01); *H01L 24/94* (2013.01); *H01L 2224/024* (2013.01); *H01L 2224/0239* (2013.01); *H01L 2224/02313* (2013.01); *H01L 2224/034* (2013.01);
(Continued)

(58) Field of Classification Search
CPC ............................... H01L 24/11; H01L 24/13
USPC .................. 257/737, 762, E23.021, E21.508, 257/E29.111, E23.068, E21.158
See application file for complete search history.

(56) References Cited

U.S. PATENT DOCUMENTS 7,034,402 B1    4/2006    Seshan
7,187,078 B2    3/2007    Lin et al.
(Continued)

OTHER PUBLICATIONS

Eaton et al., Geometry Effects on the Electromigration of Eutectic Sn/Pb Flip-Chip Solder Bumps, 44th Annual International Reliability Physics Symposium, San Jose, 2006, pp. 243-249.

*Primary Examiner* — Mamadou Diallo
(74) *Attorney, Agent, or Firm* — Robert D. Atkins; Patent Law Group: Atkins and Associates, P.C.

(57) ABSTRACT

A semiconductor device has a semiconductor wafer with a first conductive layer formed over a surface of the semiconductor wafer. A first insulating layer is formed over the surface of the semiconductor wafer and first conductive layer. A second conductive layer is formed over the first insulating layer and first conductive layer. A second insulating layer is formed over the first insulating layer and second conductive layer. A plurality of openings is formed in the second insulating layer in a bump formation area of the semiconductor wafer to expose the second conductive layer and reduce adverse effects of electro-migration. The openings are separated by portions of the second insulating layer. A UBM layer is formed over the openings in the second insulating layer in the bump formation area electrically connected to the second conductive layer. A bump is formed over the UBM layer.

25 Claims, 8 Drawing Sheets

(51) Int. Cl.
*H01L 23/532* (2006.01)
*H01L 23/525* (2006.01)

(52) U.S. Cl.
CPC ... *H01L2224/035* (2013.01); *H01L 2224/0332* (2013.01); *H01L 2224/0345* (2013.01); *H01L 2224/0361* (2013.01); *H01L 2224/03452* (2013.01); *H01L 2224/03462* (2013.01); *H01L 2224/03464* (2013.01); *H01L 2224/03505* (2013.01); *H01L 2224/03632* (2013.01); *H01L 2224/0401* (2013.01); *H01L 2224/05011* (2013.01); *H01L 2224/05012* (2013.01); *H01L 2224/05024* (2013.01); *H01L 2224/05073* (2013.01); *H01L 2224/05086* (2013.01); *H01L 2224/05088* (2013.01); *H01L 2224/05093* (2013.01); *H01L 2224/05094* (2013.01); *H01L 2224/05095* (2013.01); *H01L 2224/05096* (2013.01); *H01L 2224/05155* (2013.01); *H01L 2224/05164* (2013.01); *H01L 2224/05166* (2013.01); *H01L 2224/05169* (2013.01); *H01L 2224/05171* (2013.01); *H01L 2224/05181* (2013.01); *H01L 2224/05187* (2013.01); *H01L 2224/05583* (2013.01); *H01L 2224/05624* (2013.01); *H01L 2224/05666* (2013.01); *H01L 2224/05671* (2013.01); *H01L 2224/05687* (2013.01); *H01L 2224/118* (2013.01); *H01L 2224/1111* (2013.01); *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/11466* (2013.01); *H01L 2224/11849* (2013.01); *H01L 2224/11916* (2013.01); *H01L 2224/131* (2013.01); *H01L 2224/13006* (2013.01); *H01L 2224/13011* (2013.01); *H01L 2224/13022* (2013.01); *H01L 2224/13024* (2013.01); *H01L 2224/1357* (2013.01); *H01L 2224/13078* (2013.01); *H01L 2224/13111* (2013.01); *H01L 2224/13116* (2013.01); *H01L 2224/13553* (2013.01); *H01L 2224/16225* (2013.01); *H01L 2224/16227* (2013.01); *H01L 2224/94* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01); *H01L 2924/301* (2013.01)

(56) References Cited

U.S. PATENT DOCUMENTS

| | | | |
|---|---|---|---|
| 7,586,199 | B1 | 9/2009 | Leistiko et al. |
| 7,667,335 | B2 | 2/2010 | Lin et al. |
| 7,915,730 | B2 | 3/2011 | Chyi |
| 2007/0075423 | A1 | 4/2007 | Ke et al. |
| 2011/0156248 | A1 | 6/2011 | Matsuki |
| 2012/0211900 | A1 | 8/2012 | Choi et al. |

SEMICONDUCTOR DEVICE AND METHOD OF FORMING PATTERNED REPASSIVATION OPENINGS BETWEEN RDL AND UBM TO REDUCE ADVERSE EFFECTS OF ELECTRO-MIGRATION

CLAIM TO DOMESTIC PRIORITY

The present application is a continuation of U.S. patent application Ser. No. 13/312,730, now U.S. Pat. No. 8,963,326, filed Dec. 6, 2011, which application is incorporated herein by reference.

FIELD OF THE INVENTION

The present invention relates in general to semiconductor devices and, more particularly, to a semiconductor device and method of forming patterned repassivation openings between an RDL and UBM to reduce adverse effects of electro-migration.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Figures 1, 2:
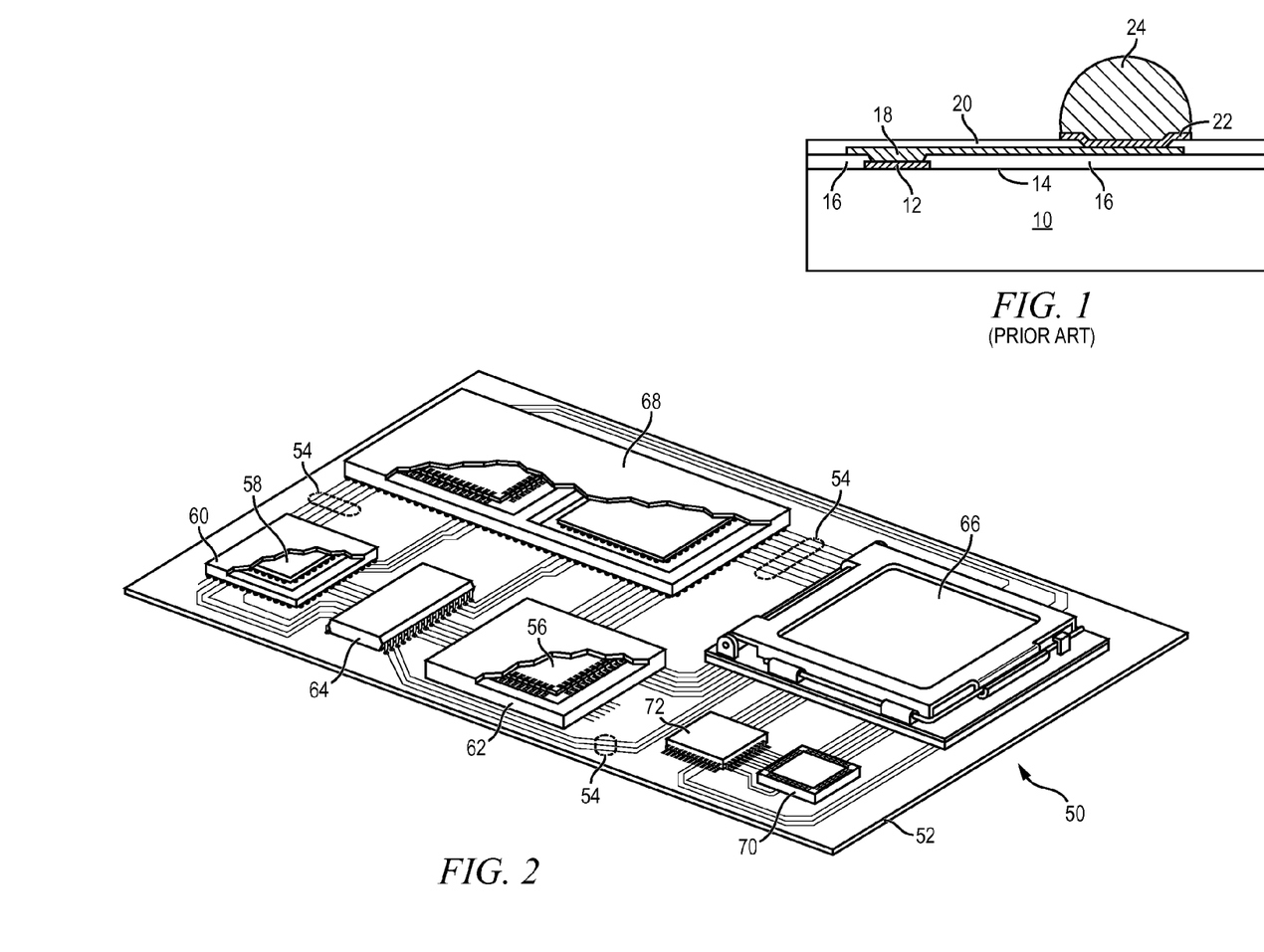
FIG. 1 illustrates a convention semiconductor die with a UBM layer and bump formed over an RDL.
FIG. 2 illustrates a printed circuit board with different types of packages mounted to its surface.

FIG. 1 shows a conventional semiconductor die 10 with contact pads 12 formed over active surface 14. An insulating layer 16 is formed over active surface 14 and contact pads 12. A redistribution layer (RDL) 18 is formed over insulating layer 16 and contact pads 12. An insulating layer 20 is formed over insulating layer 16 and RDL 18. An under bump metallization (UBM) layer 22 is formed over insulating layer 20 and RDL 18. Bump 24 is formed over UBM layer 22.

Electron momentum can be transferred to the metal atoms causing electro-migration as metal moves in the direction of electron flow. If the electro-migration displaces enough of the conductor mass, an open circuit defect or latent defect can occur. The open circuit would likely occur at the union between UBM layer 22 and RDL 18. The open circuit condition or loss of conductor mass leads to manufacturing defects or latent defects in semiconductor die 12.

SUMMARY OF THE INVENTION

A need exists to reduce adverse effects of electro-migration on an RDL and UBM. Accordingly, in one embodiment, the present invention is a method of making a semiconductor device comprising the steps of providing a semiconductor die, forming a first conductive layer over the semiconductor die, forming a first insulating layer over the first conductive layer, forming a plurality of openings in the first insulating layer over the first conductive layer, and forming a bump over the openings in the first insulating layer.

In another embodiment, the present invention is a method of making a semiconductor device comprising the steps of providing a semiconductor die, forming an insulating layer over the semiconductor die, forming a plurality of openings in the insulating layer, and forming an interconnect structure over the openings in the insulating layer.

In another embodiment, the present invention is a semiconductor device comprising a semiconductor die and a conductive layer including an interconnect site formed over the semiconductor die. An insulating layer including a first opening is formed over the interconnect site of the conductive layer. An interconnect structure is formed over the interconnect site.

In another embodiment, the present invention is a semiconductor device comprising a substrate and a first conductive layer formed over the substrate. An insulating layer including a plurality of openings is formed over the first conductive layer. An interconnect structure is formed over the openings.

BRIEF DESCRIPTION OF THE DRAWINGS

FIGS. 4a-4l illustrate a process of forming patterned repassivation openings between an RDL and UBM to reduce adverse effects of electro-migration.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 3A:
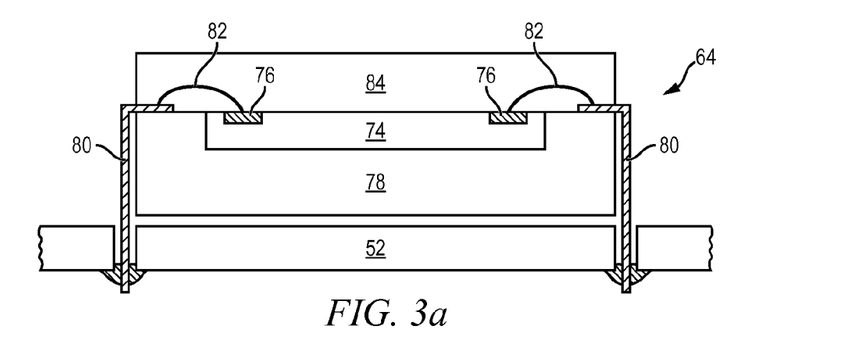
FIGS. 3a-3c illustrate further detail of the representative semiconductor packages mounted to the printed circuit board.
Figure 3B:
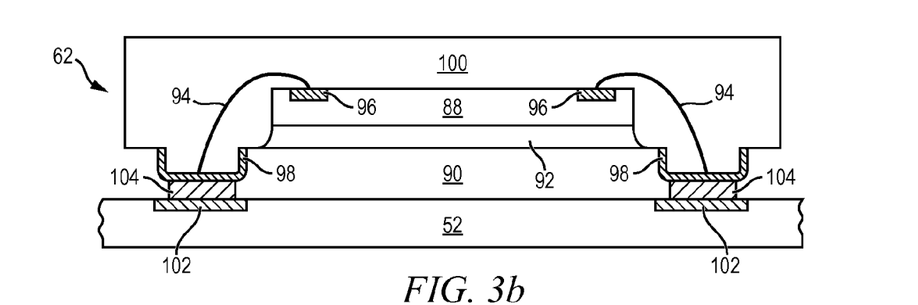
Figure 3C:
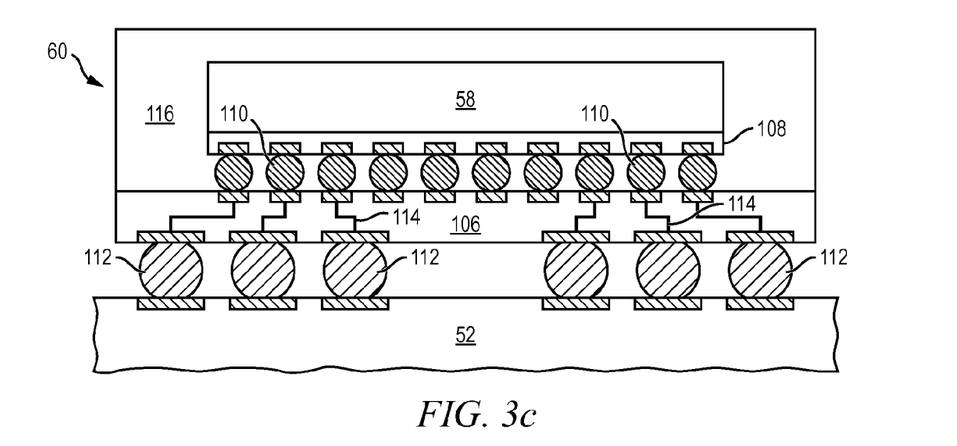

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
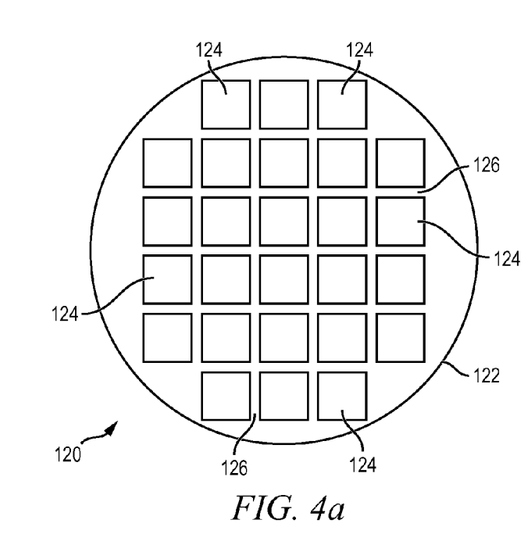

FIGS. 4a-4l illustrate, in relation to FIGS. 2 and 3a-3c, illustrate a process of forming patterned repassivation openings between an RDL and UBM to reduce adverse effects of electro-migration. FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 4B:
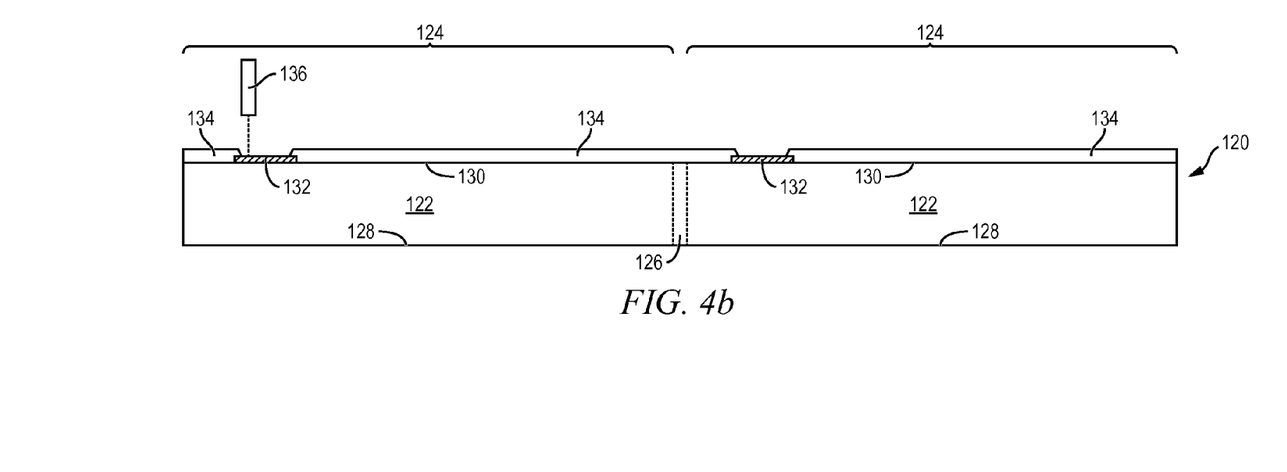

FIG. 4b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 4b. Alternatively, contact pads 132 can be offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3, or other material having similar insulating and structural properties. A portion of insulating layer 134 is removed by an etching process through a patterned photoresist layer (not shown) to expose conductive layer 132. Alternatively, a portion of insulating layer 134 can be removed by laser direct ablation (LDA) using laser 136. A portion of contact pads 132 remains covered by insulating layer 134.

Figure 4C:
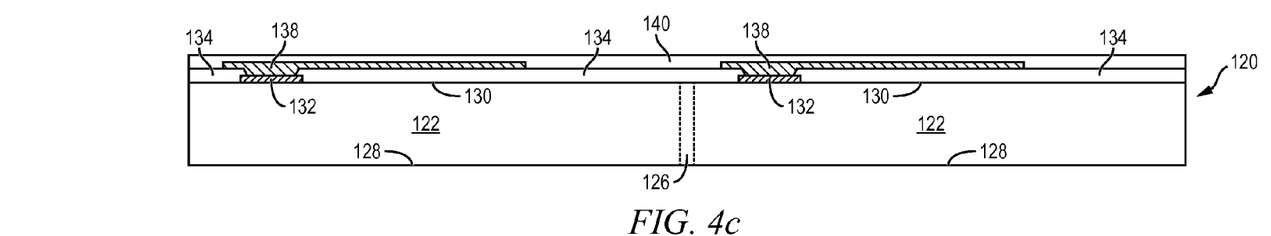

In FIG. 4c, an electrically conductive layer 138 is formed over insulating layer 134 and conductive layer 132 using a patterning and metal deposition process, such as PVD, CVD, electrolytic plating, or electroless plating process. Conductive layer 138 can be one or more layers of Al, Cu, Sn, Ni, Au, Ag, or other suitable electrically conductive material. Conductive layer 138 operates as an RDL to laterally redistribute the electrical interconnect to conductive layer 132. Conductive layer 138 is electrically connected to conductive layer 132.

A blanket repassivation or insulating layer 140 is formed over insulating layer 134 and conductive layer 138 using PVD, CVD, printing, spin coating, spray coating, sintering or thermal oxidation. Repassivation layer 140 contains one or more layers of SiO2, Si3N4, SiON, Ta2O5, Al2O3, or other material having similar insulating and structural properties.

Figure 4D:
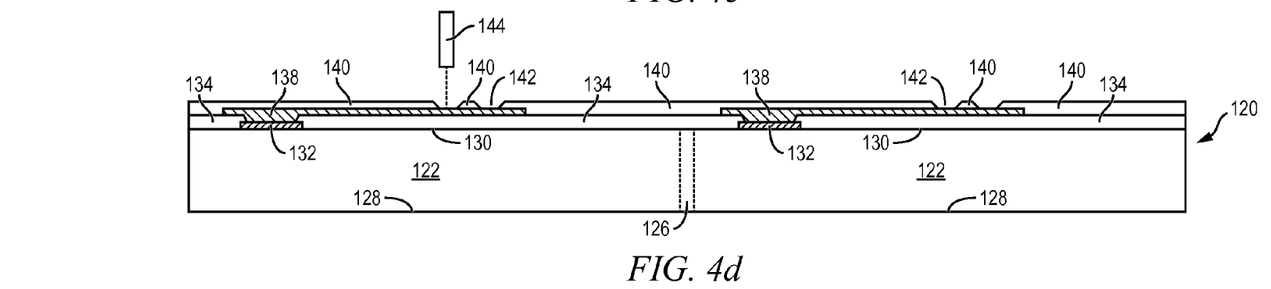

In FIG. 4d, a plurality of patterned openings 142 is formed in repassivation layer 140 by an etching process through a patterned photoresist layer to expose conductive layer 138. Alternatively, patterned openings 142 can be formed by laser direct ablation (LDA) using laser 144.

Figure 4E:
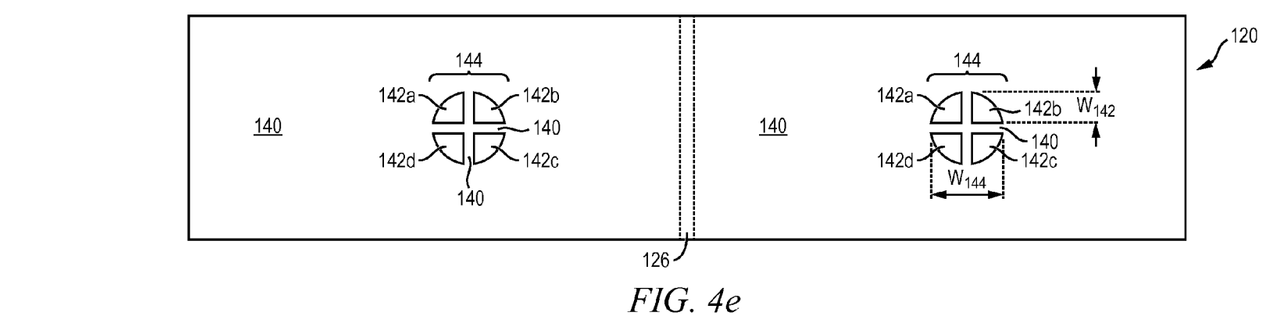

FIG. 4e shows a plan view of patterned repassivation openings 142 within area 144 designated for UBM and bump formation. In particular, patterned repassivation openings 142 are formed in a generally circular shape with four quadrants 142a-142d with a portion of repassivation layer 140 remaining to define the quadrants. Given that UBM and bump formation area 144 has a width $W_{144}$ of 240 micrometers (μm), each quadrant 142a-142d has a width $W_{142}$ of 95 μm and the combined repassivation opening area is 210 μm.

Figure 4F:
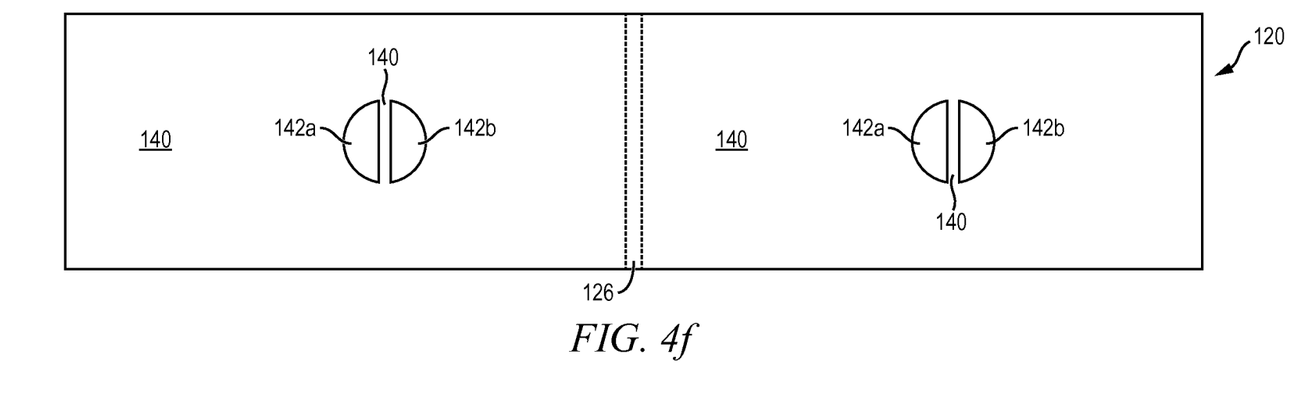
Figure 4G:
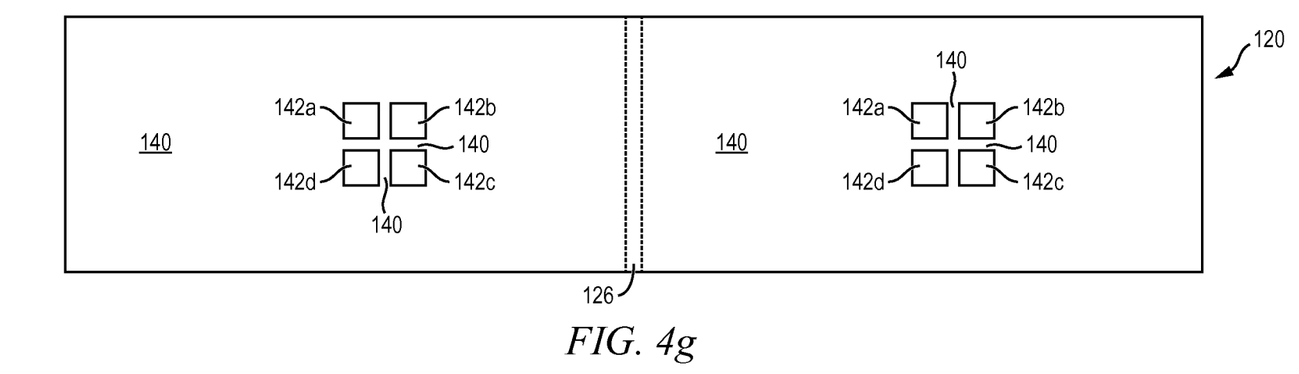
Figure 4H:
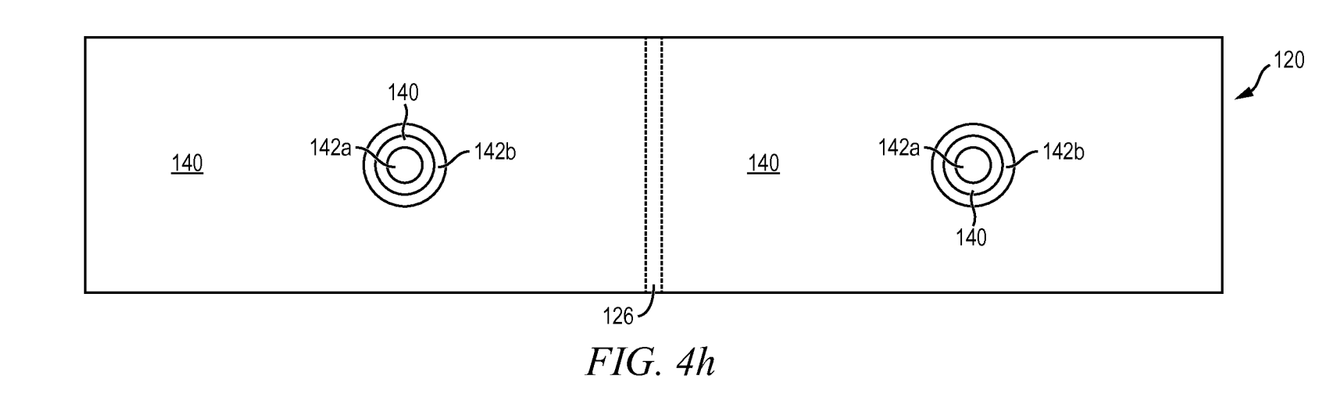
Figure 4I:
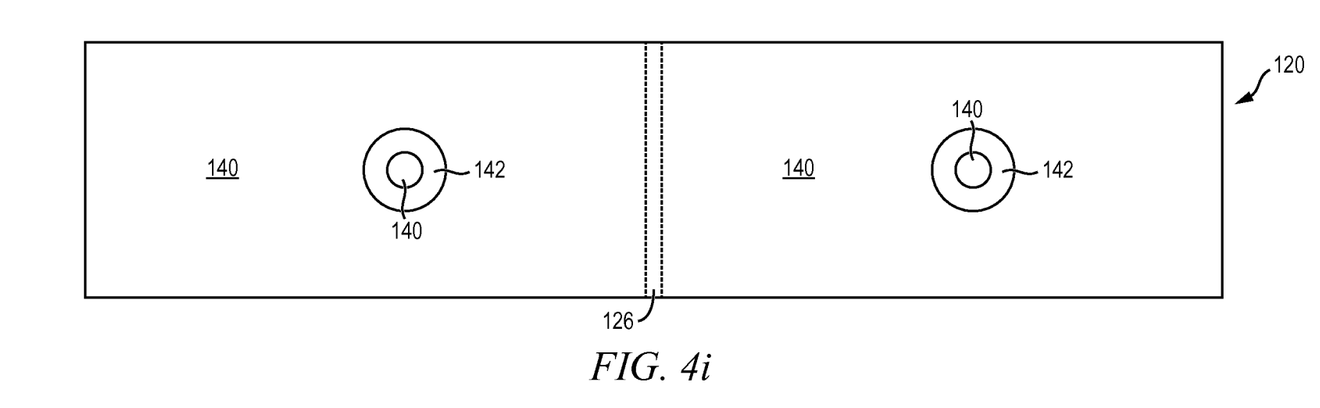
Figure 4J:
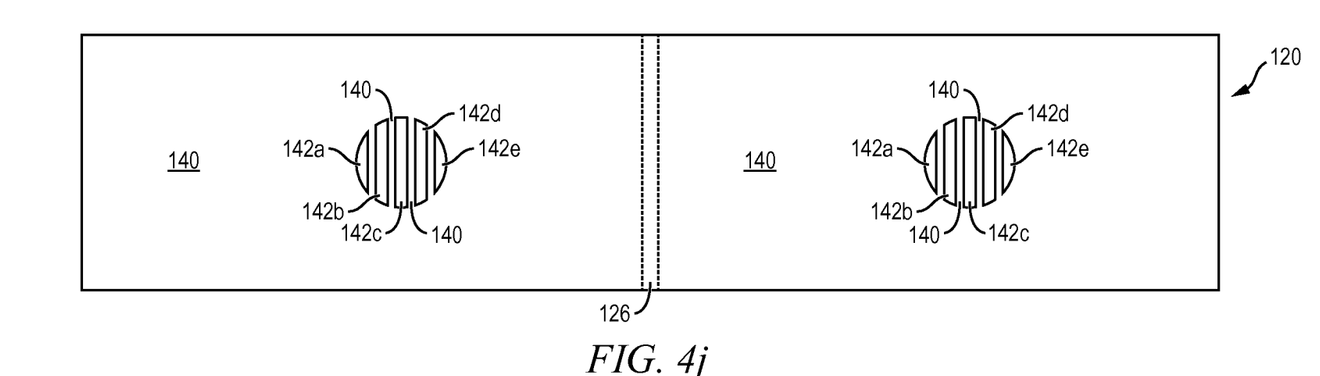

FIG. 4f shows an alternate embodiment of patterned repassivation openings 142 formed as two half circles 142a-142b with repassivation layer 140 remaining as a line segment to define the two half circles. FIG. 4g shows an embodiment of patterned repassivation openings 142 formed as four square quadrants 142a-142d with a portion of repassivation layer 140 remaining to define the square quadrants. FIG. 4h shows an embodiment of patterned repassivation openings 142 formed as concentric circles 142a-142b with repassivation layer 140 remaining between the concentric circles. FIG. 4i shows an embodiment of patterned repassivation openings 142 formed as a circle around a central repassivation layer 140. FIG. 4j shows an embodiment of patterned repassivation openings 142 formed as stripes 142a-142e with portions of repassivation layer 140 separating the striped repassivation openings.

In each case, a plurality of repassivation openings 142 are formed separated by repassivation layer 140 for sufficient current flow while maintaining an overall repassivation opening area on the order of 210 μm. In one embodiment, the overall repassivation opening area, i.e. area of four quadrants 142a-142d, is about 60% of the UBM and bump formation area 144. Electron momentum can be transferred to the metal atoms causing electro-migration as metal moves in the direction of electron flow. If the electro-migration displaces enough of the conductor mass, an open circuit defect or latent defect can occur. The open circuit would likely occur at the union between conductive layer 138 and conductive layer 146. The reduced repassivation opening area under conductive layer 146 negates the adverse effects of electro-migration while maintaining good electrical characteristics between conductive layer 146 and conductive layer 138.

Figure 4K:
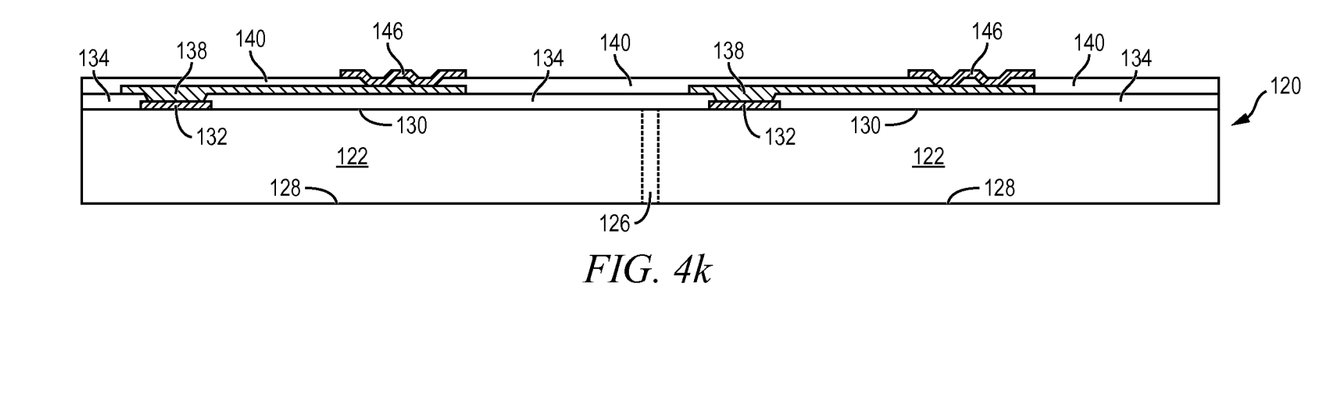

In FIG. 4k, an electrically conductive layer 146 is conformally applied over repassivation layer 140, patterned repassivation openings 142, and the exposed conductive layer 138 using a patterning and metal deposition process such as printing, PVD, CVD, sputtering, electrolytic plating, and electroless plating. Conductive layer 146 can be one or more layers of Al, Cu, Sn, Ti, Ni, Au, Ag, or other suitable electrically conductive material. Conductive layer 146 has a width of 200-300 μm and follows the contour of insulating layer 140 and the exposed conductive layer 138. In one embodiment, conductive layer 146 is a multi-layer stack UBM layer including a seed layer, barrier layer, and adhesion layer. The seed layer can be titanium copper (TiCu), titanium tungsten copper (TiWCu), or tantalum nitrogen copper (TaNCu). The barrier layer can be Ni, nickel vanadium (NiV), platinum (Pt), palladium (Pd), TiW, or CrCu, or other suitable material. The adhesion layer can be Ti, TiN, TiW, Al, or chromium (Cr), or other suitable material. Conductive layer 146 is electrically connected to conductive layer 138.

In FIG. 4l, an electrically conductive bump material is deposited over conductive layer 146 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 146 using a suitable attachment or bonding process. In one embodiment, the bump material is reflowed by heating the material above its melting point to form balls or bumps 148. In some applications, bumps 148 are reflowed a second time to improve electrical contact to conductive layer 146. Bumps 148 can also be compression bonded to conductive layer 146. Bumps 148 represent one type of interconnect structure that can be formed over conductive layer 146. The interconnect structure can also use stud bump, micro bump, or other electrical interconnect.

Semiconductor wafer 120 is singulated through insulating layer 134, repassivation layer 140, and saw street 126 with saw blade or laser cutting tool 150 into individual semiconductor die 124.

Figure 5:
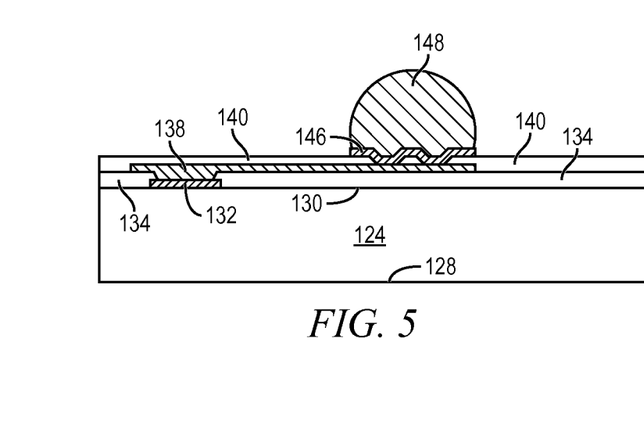
FIG. 5 illustrates the semiconductor die with patterned repassivation openings formed between the RDL and UBM to reduce adverse effects of electro-migration.

FIG. 5 shows semiconductor die 124 after singulation. The circuits on active surface 130 of semiconductor die 124 are electrically connected through conductive layers 132, 138, and 146, and bumps 148 to external devices. The repassivation layer 140 includes patterned repassivation openings 142 for conductive layer 146 to make electrical connection to conductive layer 138. The patterned repassivation openings 142 can have a variety of shapes and are separated by repassivation layer 140. The patterned repassivation openings 142 occupy less than all of the surface area designated for conductive layer 146 and bump 148. The patterned repassivation openings 142 reduce the adverse effects of electro-migration while maintaining good electrical characteristics between conductive layer 146 and conductive layer 138.

In summary, conductive layer 132 is formed over a surface of semiconductor wafer 120. The insulating layer 134 is formed over the surface of semiconductor wafer 120 and conductive layer 132. Conductive layer 138 is formed over the insulating layer 134 and conductive layer 132. The insulating layer 140 is formed over insulating layer 134 and conductive layer 138. A plurality of patterned openings 142, e.g. two to four openings, is formed in insulating layer 142 in bump formation area 144 to expose conductive layer 138. The patterned openings 142 are separated by portions of insulating layer 140. The patterned openings 142 in bump formation area 144 occupy less than the entire bump formation area. Conductive layer 146 is formed over patterned openings 142 in bump formation area 144 electrically connected to conductive layer 138. Bump 148 is formed over conductive layer 146. The patterned openings 142 in bump formation area 144 reduce adverse effects of electro-migration of conductive layer 138 or conductive layer 146.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   forming a first conductive layer over the semiconductor die;
   forming an insulating layer over the first conductive layer;
   forming a first opening and a second opening in the insulating layer over the first conductive layer; and
   forming a first bump over the first and second openings in the insulating layer.

2. The method of claim 1, further including forming the first bump over an interconnect site of the first conductive layer, wherein an interconnect site is an area of the first conductive layer directly below the first and second openings, wherein further the first and second openings occupy 60 percent or less of the interconnect site.

3. The method of claim 1, further including:
   forming a contact pad over the semiconductor die; and
   forming the first conductive layer over the contact pad.

4. The method of claim 1, further including:
   forming a second conductive layer over the first and second openings in the insulating layer; and
   forming the first bump over the second conductive layer.

5. The method of claim 1, wherein the first and second openings in the insulating layer are separated by a continuous portion of the insulating layer.

6. The method of claim 1, wherein the first and second openings in the insulating layer reduce electro-migration under the first bump.

7. A method of making a semiconductor device, comprising:
   providing a semiconductor die;
   forming an insulating layer over the semiconductor die;
   forming a first opening and a second opening in the insulating layer; and
   forming an interconnect structure over the first and second openings in the insulating layer.

8. The method of claim 7, wherein the interconnect structure is a bump.

9. The method of claim 7, further including:
forming a conductive layer including an interconnect site over the semiconductor die, wherein the interconnect site is an area of the conductive layer directly below the first and second openings; and
forming the insulating layer over the conductive layer.

10. The method of claim 9, further including forming the first and second openings in the insulating layer over the interconnect site, wherein the first and second openings over the interconnect site expose less than an entire area of the interconnect site.

11. The method of claim 9, further including forming the first and second openings in the insulating layer over the interconnect site, wherein the first and second openings over the interconnect site occupy about 60 percent of the interconnect site.

12. The method of claim 7, wherein the first and second openings are separated by a continuous portion of the insulating layer.

13. The method of claim 7, wherein the first and second openings in the insulating layer reduce adverse effects of electro-migration.

14. A semiconductor device, comprising:
a semiconductor die;
a first conductive layer including an interconnect site formed over the semiconductor die;
an insulating layer including a first opening and a second opening formed over the interconnect site of the first conductive layer; and
an interconnect structure formed directly over the first and second openings and directly over the interconnect site, wherein the interconnect site is an area of the first conductive layer directly below the first and second openings.

15. The semiconductor device of claim 14, wherein the first and second openings expose less than an entire area of the interconnect site.

16. The semiconductor device of claim 14, wherein a portion of the insulating layer is disposed over a central region of the interconnect site.

17. The semiconductor device of claim 14, further including a second conductive layer formed over the interconnect site of the first conductive layer.

18. The semiconductor device of claim 14, wherein the first and second openings are separated by a portion of the insulating layer.

19. The semiconductor device of claim 17, further including the interconnect structure formed over the second conductive layer.

20. The semiconductor device of claim 14, wherein the interconnect structure includes a bump.

21. A semiconductor device, comprising:
a substrate;
a first conductive layer formed over the substrate;
an insulating layer including a plurality of openings formed over the first conductive layer; and
a discrete interconnect structure formed over and on top of the plurality of openings.

22. The semiconductor device of claim 21, further including the discrete interconnect structure formed over an interconnect site of the first conductive layer, wherein the openings occupy less than an entire area of the interconnect site, wherein further the interconnect site is an area of the first conductive layer directly below all of the plurality openings.

23. The semiconductor device of claim 21, further including a second conductive layer formed over the openings.

24. The semiconductor device of claim 21, wherein the substrate includes a semiconductor die or a semiconductor wafer.

25. The semiconductor device of claim 21, further including at least two openings formed in the insulating layer, the at least two openings separated by a portion of the insulating layer.

* * * * *